United States Patent
Palm et al.

(10) Patent No.: US 10,192,849 B2
(45) Date of Patent: Jan. 29, 2019

(54) SEMICONDUCTOR MODULES WITH SEMICONDUCTOR DIES BONDED TO A METAL FOIL

(71) Applicant: Infineon Technologies AG, Neubiberg (DE)

(72) Inventors: Petteri Palm, Regensburg (DE); Alexander Heinrich, Bad Abbach (DE); Holger Torwesten, Regensburg (DE); Tobias Simbeck, Regensburg (DE)

(73) Assignee: Infineon Technologies AG, Neubiberg (DE)

( * ) Notice: Subject to any disclaimer, the term of this patent is extended or adjusted under 35 U.S.C. 154(b) by 355 days.

(21) Appl. No.: 14/176,621

(22) Filed: Feb. 10, 2014

(65) Prior Publication Data
US 2015/0228616 A1    Aug. 13, 2015

(51) Int. Cl.
*H01L 21/78* (2006.01)
*H01L 23/00* (2006.01)
(Continued)

(52) U.S. Cl.
CPC .......... *H01L 24/83* (2013.01); *H01L 21/4832* (2013.01); *H01L 21/78* (2013.01);
(Continued)

(58) Field of Classification Search
CPC ............... H01L 23/49534; H01L 24/83; H01L 23/49572; H01L 23/49579; H01L 23/49582
See application file for complete search history.

(56) References Cited

U.S. PATENT DOCUMENTS 5,757,073 A * 5/1998 Hoffmeyer .......... H01L 23/3672
156/94
7,759,777 B2    7/2010 Otremba et al.
(Continued)

FOREIGN PATENT DOCUMENTS

| CN | 101980870 A | 2/2011 |
| CN | 103563110 A | 2/2014 |
| DE | 102007017831 A1 | 10/2008 |

OTHER PUBLICATIONS

Sommadossi, Silvana A., "Investigation on Diffusion Soldering in Cu/in/CU and Cu/In-48Sn/Cu Systems", Dissertation, Stuttgart Max-Planck-Inst. für Metallforschung, 2002, 2002, pp. 1-117.

*Primary Examiner* — Daniel Whalen
(74) *Attorney, Agent, or Firm* — Murphy, Bilak & Homiller, PLLC

(57) ABSTRACT

A method of manufacturing semiconductor modules includes providing a metal composite substrate including a metal foil attached to a metal layer, the metal foil being thinner than and comprising a different material than the metal layer, attaching a first surface of a plurality of semiconductor dies to the metal foil prior to structuring the metal foil, and encasing the semiconductor dies attached to the metal foil in an electrically insulating material. The metal layer and the metal foil are structured after the semiconductor dies are encased with the electrically insulating material so that surface regions of the electrically insulating material are devoid of the metal foil and the metal layer. The electrically insulating material is divided along the surface regions devoid of the metal foil and the metal layer to form individual modules.

20 Claims, 17 Drawing Sheets

(51) Int. Cl.
  *H01L 23/495* (2006.01)
  *H01L 21/48* (2006.01)
  *H01L 21/56* (2006.01)

(52) U.S. Cl.
  CPC .. *H01L 23/49513* (2013.01); *H01L 23/49541* (2013.01); *H01L 23/49562* (2013.01); *H01L 24/19* (2013.01); *H01L 24/20* (2013.01); *H01L 24/24* (2013.01); *H01L 24/73* (2013.01); *H01L 24/82* (2013.01); *H01L 24/92* (2013.01); *H01L 24/97* (2013.01); H01L 21/561 (2013.01); H01L 21/568 (2013.01); H01L 23/562 (2013.01); H01L 24/05 (2013.01); H01L 24/29 (2013.01); H01L 24/32 (2013.01); H01L 2224/04026 (2013.01); H01L 2224/04105 (2013.01); H01L 2224/05082 (2013.01); H01L 2224/05083 (2013.01); H01L 2224/05124 (2013.01); H01L 2224/05147 (2013.01); H01L 2224/05155 (2013.01); H01L 2224/05166 (2013.01); H01L 2224/05639 (2013.01); H01L 2224/06181 (2013.01); H01L 2224/24246 (2013.01); H01L 2224/27831 (2013.01); H01L 2224/291 (2013.01); H01L 2224/2918 (2013.01); H01L 2224/2926 (2013.01); H01L 2224/29109 (2013.01); H01L 2224/29111 (2013.01); H01L 2224/29147 (2013.01); H01L 2224/29393 (2013.01); H01L 2224/32245 (2013.01); H01L 2224/73267 (2013.01); H01L 2224/82031 (2013.01); H01L 2224/82039 (2013.01); H01L 2224/83005 (2013.01); H01L 2224/8382 (2013.01); H01L 2224/8384 (2013.01); H01L 2224/8385 (2013.01); H01L 2224/83192 (2013.01); H01L 2224/83203 (2013.01); H01L 2224/83447 (2013.01); H01L 2224/83455 (2013.01); H01L 2224/83801 (2013.01); H01L 2224/83825 (2013.01); H01L 2224/83931 (2013.01); H01L 2224/92244 (2013.01); H01L 2224/97 (2013.01); H01L 2924/01013 (2013.01); H01L 2924/12042 (2013.01); H01L 2924/13055 (2013.01); H01L 2924/13091 (2013.01); H01L 2924/181 (2013.01); H01L 2924/2064 (2013.01); H01L 2924/20641 (2013.01); H01L 2924/20642 (2013.01); H01L 2924/20644 (2013.01)

(56) References Cited

U.S. PATENT DOCUMENTS

| | | | |
|---|---|---|---|
| 2007/0084719 A1* | 4/2007 | Wickersham, Jr. | ................... C23C 14/3407 204/298.12 |
| 2008/0105965 A1* | 5/2008 | Song | ............... H01L 23/3128 257/686 |
| 2008/0251903 A1 | 10/2008 | Otremba et al. | |
| 2009/0305076 A1* | 12/2009 | Wong | ............... H01L 21/6835 428/607 |
| 2010/0044885 A1* | 2/2010 | Fuergut | ............... H01L 21/561 257/784 |
| 2010/0046188 A1* | 2/2010 | Bayan | ............... H01L 21/4832 361/809 |
| 2012/0235309 A1* | 9/2012 | Essig | ............... H01L 23/488 257/782 |
| 2013/0140685 A1 | 6/2013 | Heinrich et al. | |
| 2014/0035113 A1* | 2/2014 | Kierse | ............... H01L 23/49541 257/676 |

* cited by examiner

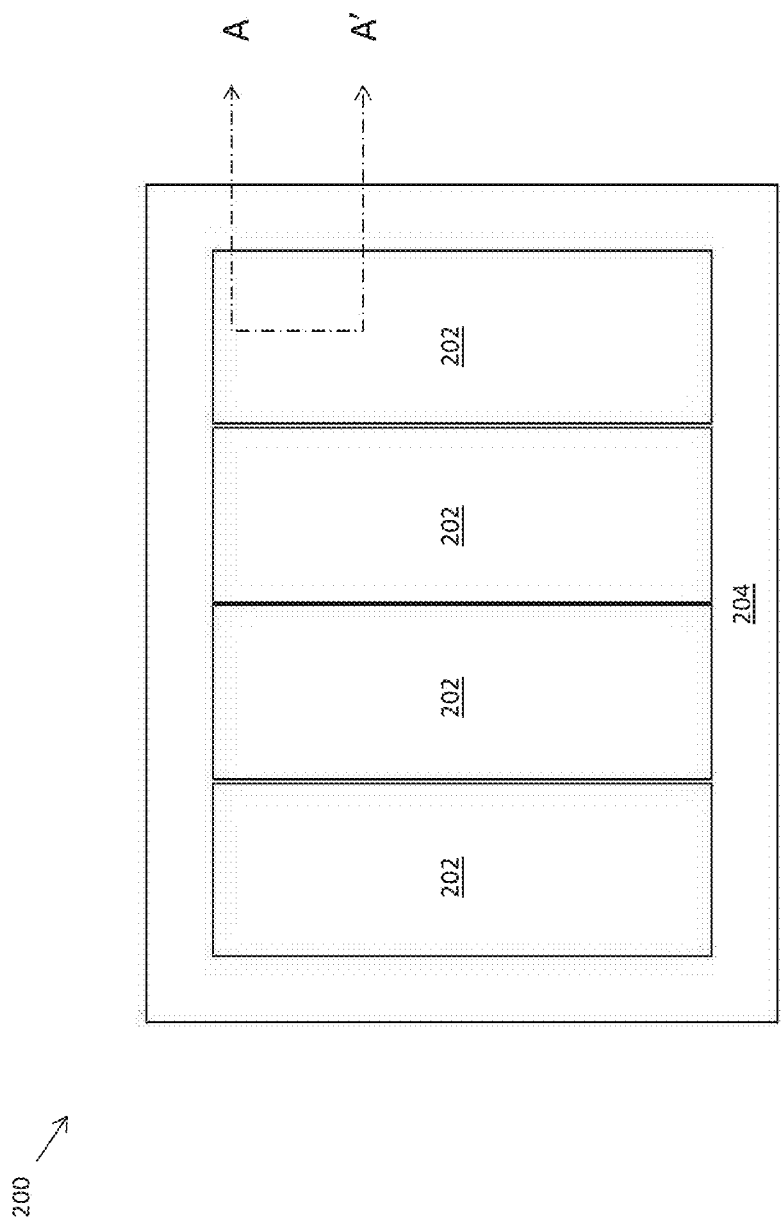

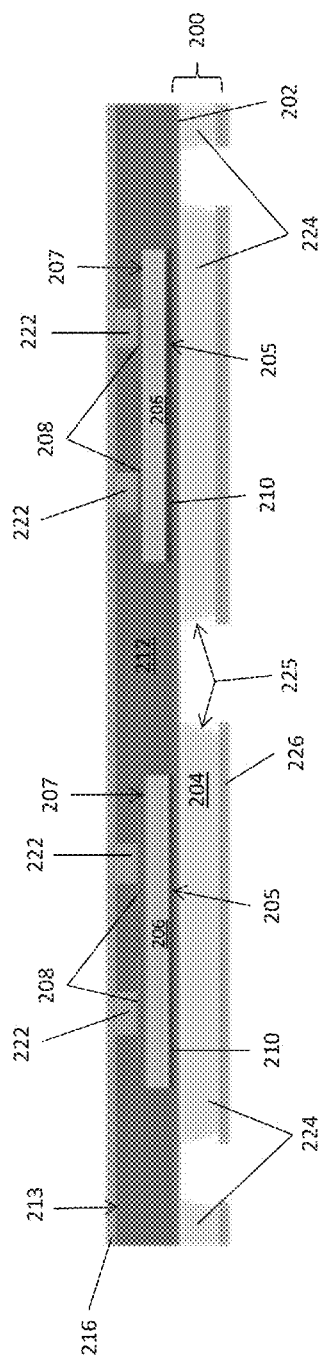
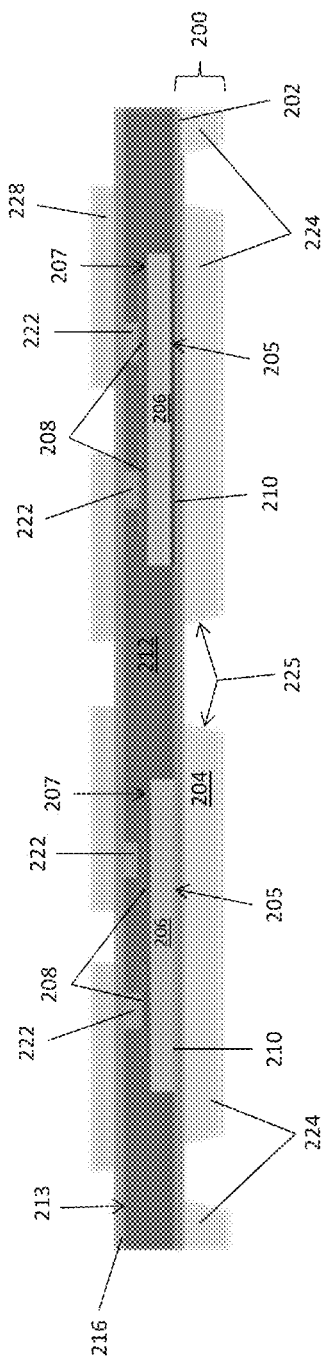
Figure 2H
Figure 2I

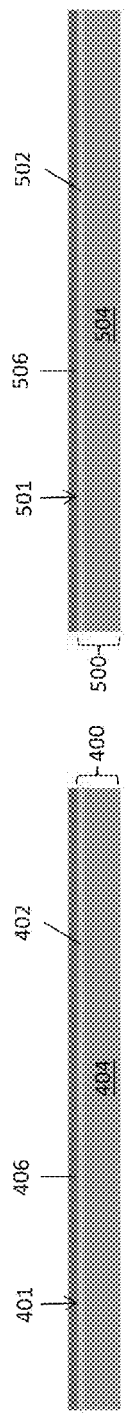
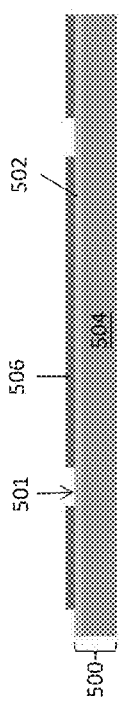
Figure 4A
Figure 5A
Figure 5B
Figure 5C

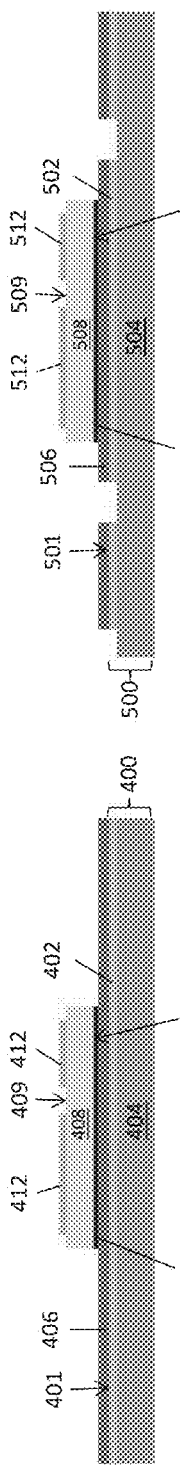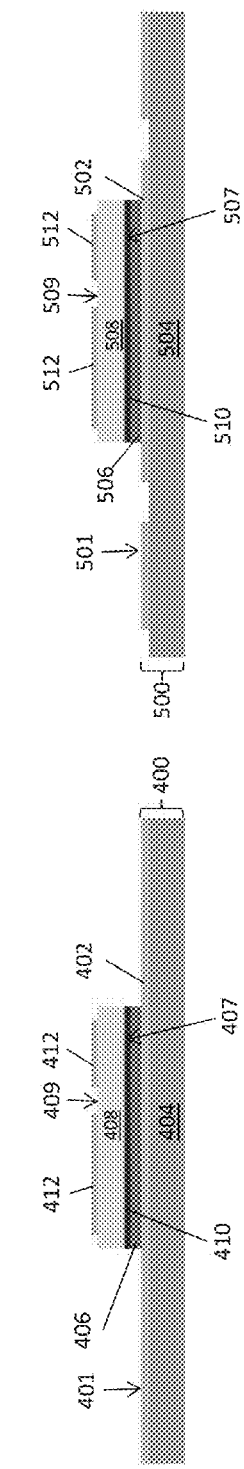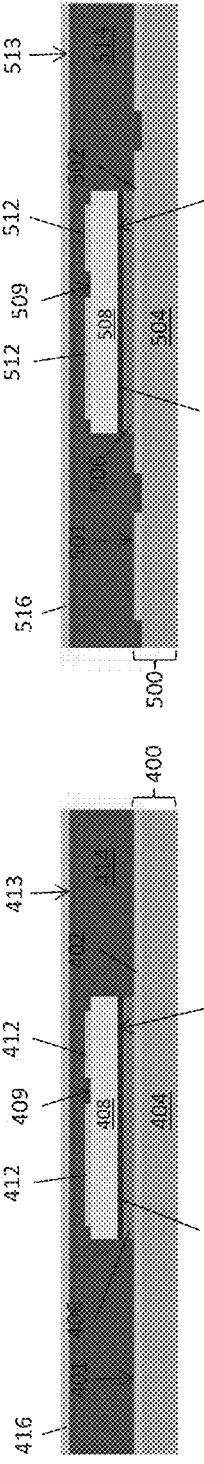

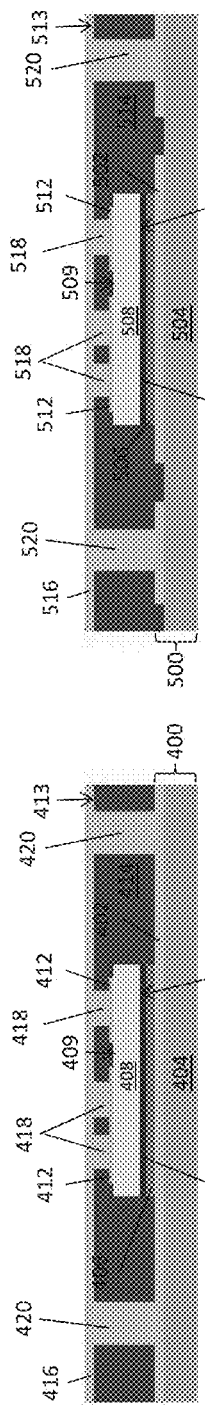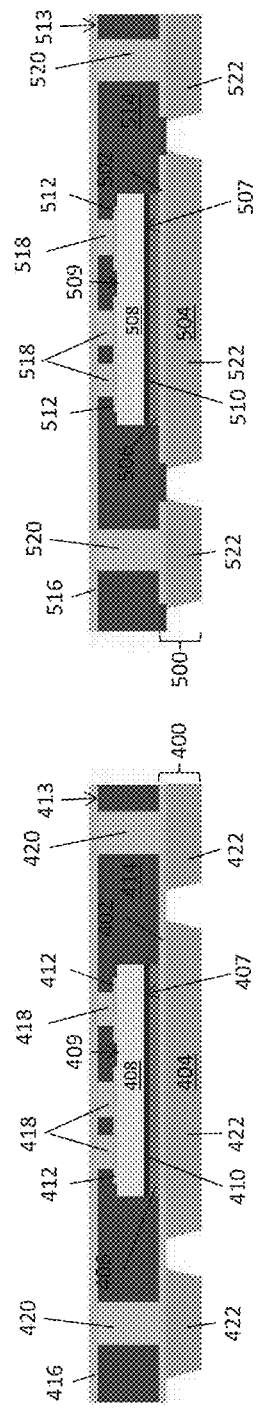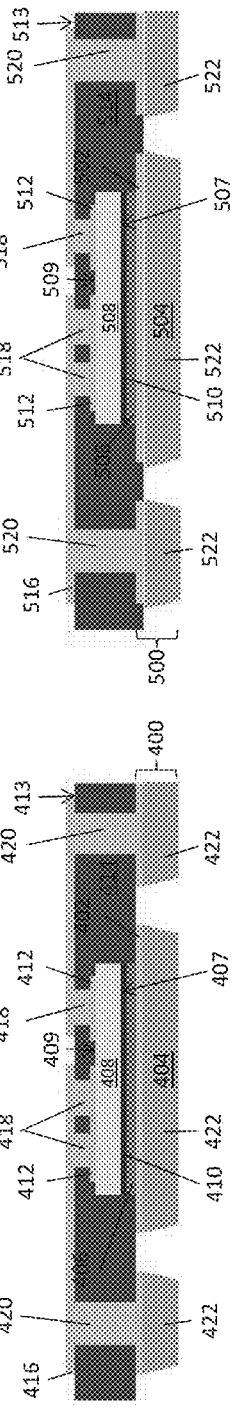

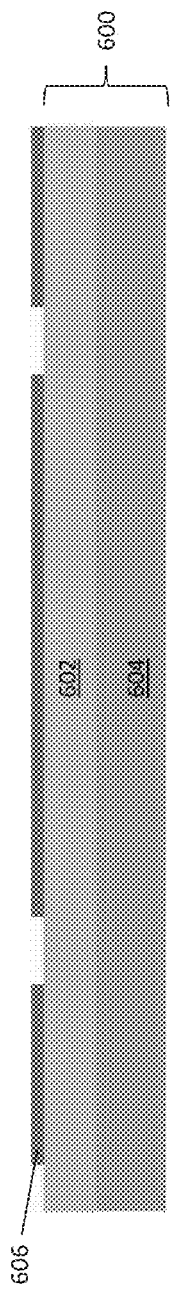
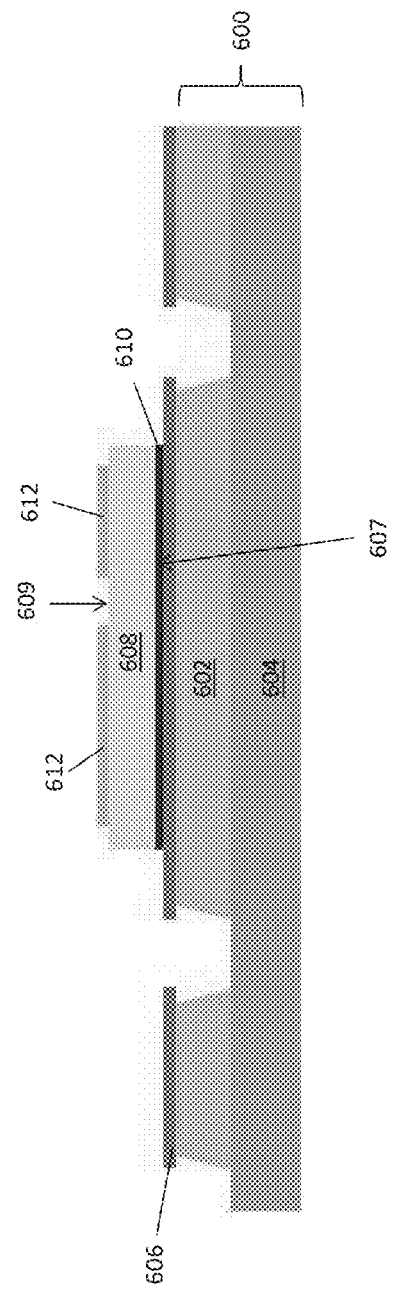
Figure 6C
Figure 6D

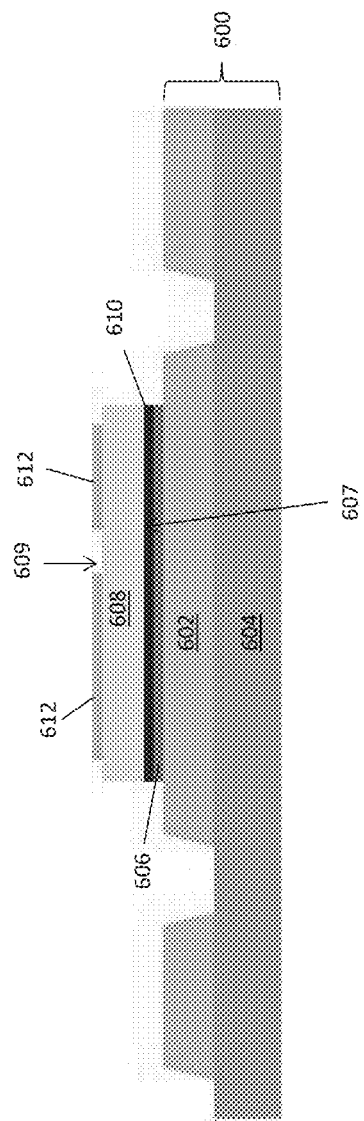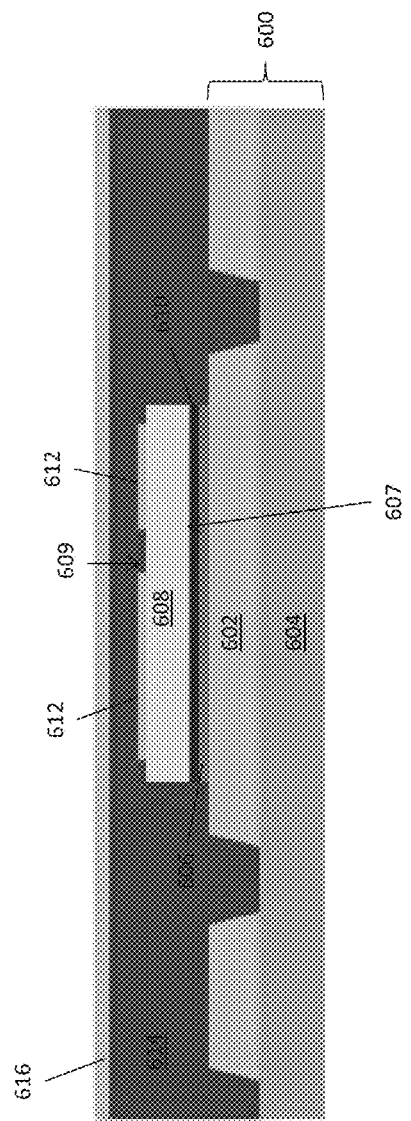

SEMICONDUCTOR MODULES WITH SEMICONDUCTOR DIES BONDED TO A METAL FOIL

TECHNICAL FIELD

The present application relates to semiconductor modules, in particular manufacturing of semiconductor modules having semiconductor dies bonded to a metal foil.

BACKGROUND

Recent advancements in power semiconductor die (chip) packaging technology utilize chip embedding concepts. Standard packaging processes such as wire or clip bonding, as well as common molding techniques, are replaced with galvanic processes. The semiconductor dies also are protected by a laminate. The results are a significantly reduced package footprint, package resistance and inductance, as well as low thermal resistance. For example, dies are typically soldered to structured lead frames. During the panel lamination process, several lead frames, together with FR4 laminate, are laminated together.

Due to aligning tolerances between the lead frames and non-linear shrinkage/expansion during the lamination process caused by aligning fixing pins that keep the lead frames in position, optical measurement of die and lead frame positions and corresponding data file corrections are required. Also, warpage of the dies, lead frames and panel is relatively high due to CTE (coefficient of thermal expansion) mismatch and thickness differences between the lead frames and dies, causing differences in micro-via height and challenges in the lamination and micro-via plating processes.

Furthermore, the die attach solder is conventionally deposited on the wafer back surface before die singulation (separation) in case of diffusion solder, or is dispensed on the die pad of the lead frames or stencil printed to the wafer back surface as well. Dicing through a thick metal layer on the backside of a wafer is challenging and reduces dicing quality, lowers throughput and reduces the life time of the dicing blade. Also, part of the solder on the die backside is squeezed out during the bonding process. This 'squeeze out' of the die backside solder is not uniform, not easy to control and not repeatable.

SUMMARY

According to an embodiment of a method of manufacturing semiconductor modules, the method comprises: providing a metal composite substrate including a metal foil attached to a metal layer, the metal foil being thinner than and comprising a different material than the metal layer; attaching a first surface of a plurality of semiconductor dies to the metal foil prior to structuring the metal foil; encasing the semiconductor dies attached to the metal foil in an electrically insulating material; structuring the metal layer and the metal foil after the semiconductor dies are encased with the electrically insulating material so that surface regions of the electrically insulating material are devoid of the metal foil and the metal layer; and dividing the electrically insulating material along the surface regions devoid of the metal foil and the metal layer to form individual modules.

According to an embodiment of a semiconductor module, the semiconductor module comprises a metal composite substrate including a metal layer attached to a first surface of a structured metal foil. The structured metal foil has a second surface opposite the first surface and is thinner than the metal layer. The metal layer has tapered sidewalls extending outward from the first surface of the structured metal foil. The semiconductor module further comprises at least one semiconductor die having a first surface attached to the second surface of the structured metal foil, a laminate attached to the second surface of the structured metal foil and encasing the at least one semiconductor die, and a structured metal layer on a surface of the laminate facing away from the metal composite substrate. The structured metal foil has sidewalls extending outward from the laminate. The sidewalls of the structured metal foil are uncovered by the laminate and aligned with the sidewalls of the metal layer of the metal composite substrate. The laminate has an edge extending between opposing first and second main surfaces of the laminate. The edge of the laminate is uncovered by metal.

According to an embodiment of a method of attaching semiconductor dies to a metal composite substrate, the method comprises: providing a metal composite substrate including a metal foil attached to a metal layer, the metal foil being thinner than and comprising a different material than the metal layer; coating a surface of the metal foil opposite the metal layer with solder of a lower melting point than the metal foil and the metal layer; diffusion soldering a first surface of a plurality of semiconductor dies to the metal foil via the solder, including isothermal solidification of the solder to high melting point phases; and encasing the semiconductor dies in an electrically insulating material after the first surface of the semiconductor dies is diffusion soldered to the metal foil.

Those skilled in the art will recognize additional features and advantages upon reading the following detailed description, and upon viewing the accompanying drawings.

BRIEF DESCRIPTION OF THE FIGURES

The elements of the drawings are not necessarily to scale relative to each other. Like reference numerals designate corresponding similar parts. The features of the various illustrated embodiments can be combined unless they exclude each other. Embodiments are depicted in the drawings and are detailed in the description which follows.

FIG. 2, which includes FIGS. 2A through 2K, illustrates an embodiment of a method of manufacturing the semiconductor module of FIG. 1.

FIG. 4, which includes FIGS. 4A through 4G, illustrates an embodiment of a method of manufacturing a semiconductor module based on the diffusion soldering method of FIG. 3.

FIG. 5, which includes FIGS. 5A through 5I, illustrates another embodiment of a method of manufacturing a semiconductor module based on the diffusion soldering method of FIG. 3.

FIG. 6, which includes FIGS. 6A through 6H, illustrates yet another embodiment of a method of manufacturing a semiconductor module based on the diffusion soldering method of FIG. 3.

DETAILED DESCRIPTION

According to some embodiments described herein, a relatively thick metal composite substrate is provided for bonding semiconductor dies to a thin metal foil of the metal composite substrate using a batch die attach process. A metal layer can be used to structure the metal foil. The metal foil can also be structured before optional solder coating, bonding and lamination. According to other embodiments described herein, the die attach solder is deposited on the metal foil instead of the dies, eliminating the need to singulate (separate) dies with a thick backside metallization. The die attach solder deposited on the metal foil can be used as a hard mask to pattern the unstructured metal foil, and the solder can be removed if desired by a simple selective etching process after the die attach process. These embodiments can be combined at least to the extent that such combinations are not mutually exclusive.

Figure 1:
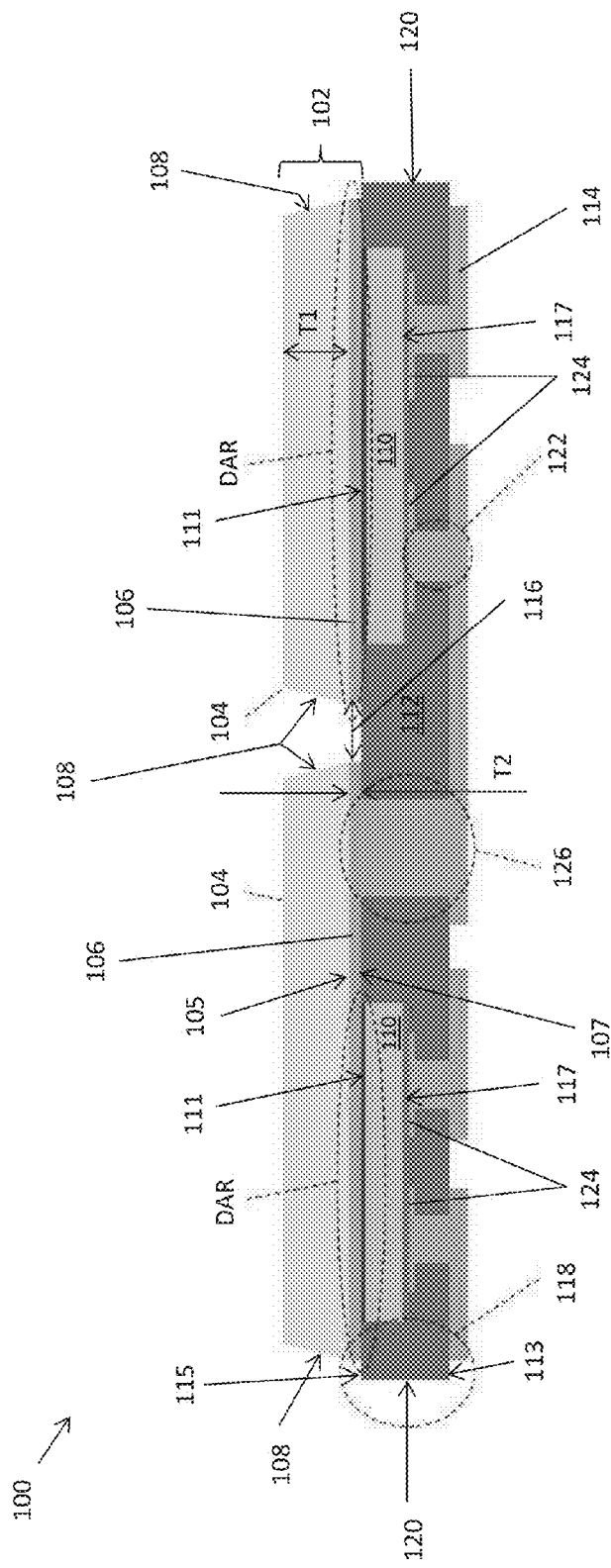
FIG. 1 illustrates a cross-sectional view of an embodiment of a semiconductor module.

FIG. 1 illustrates a cross-sectional view of an embodiment of a semiconductor module 100. The semiconductor module 100 comprises a metal composite substrate 102 including a metal layer 104 such as an aluminum layer attached to a first surface 105 of a structured metal foil 106 such as a copper foil. The structured metal foil 106 has a second surface 107 opposite the first surface 105 and is thinner than the metal layer 104. For example, the metal layer 104 can have a thickness (T1) between 30 µm and 400 µm and the structured metal foil 106 can have a thickness (T2) between 3 µm and 100 µm. The metal layer 104 has tapered sidewalls 108 extending outward from the first surface 105 of the structured metal foil 106.

The semiconductor module 100 further comprises at least one semiconductor die 110 having a first surface 111 attached to the second surface 107 of the structured metal foil 106. This region of connection/attachment between the dies 110 and the structured metal foil 106 is labeled 'DAR' in FIG. 1, which is shorthand for 'die attach region'. Any type of semiconductor die 110 can be included in the module 100, such as power semiconductor dies like power MOSFETs (metal oxide semiconductor field effect transistors) or IGBTs (insulated gate bipolar transistors), logic dies (e.g. driver, controller) that are bonded to the metal foil 106 e.g. by an insulating adhesive (no back side connection), etc.

The semiconductor module 100 also comprises a dielectric layer 112 such as a laminate, resin layer, etc. attached to the second surface 107 of the structured metal foil 106 and a structured metal layer 114 on a surface 113 of the dielectric layer 112 facing away from the metal composite substrate 102. The dielectric layer 112 encases the semiconductor dies 110.

The structured metal foil 106 has sidewalls 116 extending outward from the dielectric layer 112. The sidewalls 116 of the structured metal foil 106 are uncovered by the dielectric layer 112 and aligned with the sidewalls 108 of the metal layer 104 of the metal composite substrate 102. The dielectric layer 112 has an edge region 118 where the edge 120 of the dielectric layer 112 extends between opposing first and second main surfaces 113, 115 of the dielectric layer 112. The edge 120 of the dielectric layer 112 is uncovered by metal.

One or more first micro-via connections 122 extend through the dielectric layer 112 from a second surface 117 of the dies 110 opposite the first surface 111 to the structured metal layer 114 on the surface 113 of the dielectric layer 112 facing away from the metal composite substrate 102. The first micro-via connections 122 provide points of external electrical contact for terminals 124 at the second surface 117 of the dies 110.

One or more second micro-via connections 126 extend through the dielectric layer 112 from the structured metal foil 106 to the structured metal layer 114 on the surface 113 of the dielectric layer 112 facing away from the metal composite substrate 102. The second micro-via connections 126 provide points of external electrical contact for terminals at the first surface 111 of the dies 110. If one or more of the dies 110 do not have a terminal at the first surface 111 of the dies 110 (e.g. in the case of lateral transistor dies), then the second micro-via connections 126 can be omitted. Whether a terminal is provided at the first surface 111 of the dies 110 depends on the type of die, and therefore such terminals are not shown in FIG. 1 for ease of illustration. The metal layer 104 of the metal composite substrate 102 can be structured as shown in FIG. 1 and act as a heat sink during operation of the dies 110, dissipating heat from the first surface 111 of the dies 110 through the structured metal foil 106.

Figure 2B:
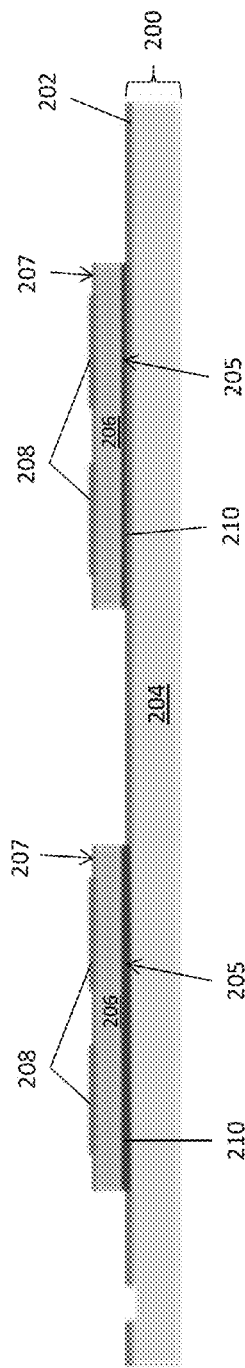

FIG. 2, which includes FIGS. 2A through 2K, illustrates an embodiment of a method of manufacturing a semiconductor module of the kind illustrated in FIG. 1. FIG. 2A is a top-down plan view of a metal composite substrate panel 200 including metal foil strips 202 on a metal layer 204. In general, the metal foil can cover the entire metal layer 204 and can also be structured. The metal foil strips 202 are thinner than and comprise a different material than the metal layer 204. In one embodiment, the metal layer 204 is an aluminum layer having a thickness between 50 µm and 200 µm and the metal foil strips 202 are copper foil strips each having a thickness between 3 µm and 100 µm. Copper foils can be plated, coated, sputtered, etc. onto an aluminum layer. In one example the substrate 200 is a Cu/Al composite substrate including Cu foil strips 202 having a thickness of about 9 µm and an Al layer 204 having a thickness of about 100 µm.

The metal foil strip arrangement shown in FIG. 2A allows for a higher package density because the entire production panel 200 can be used for assembly. Also, the metal foil strip arrangement allows for a higher maximum current for testing the usable area of the modules where the dies are attached. The mechanical properties of the metal composite substrate panel 200 formed by the metal foil strips 202 and the metal layer 204 can be adjusted by optimizing the material thicknesses. The metal composite structure of the panel 200 yields a more stable panel and also the sub-processes are more feasible and reliable. FIGS. 2B through 2K are respective cross-sectional views taken along the line labeled A-A' in FIG. 2A at different stages of the manufacturing method.

In FIG. 2B, a first surface 205 of a plurality of semiconductor dies 206 is attached to the illustrated metal foil 202 prior to structuring of the metal foil 202. The first surface 205 of the dies can have one or more terminals or be devoid of terminals as previously described herein, and therefore terminals are not shown at the first surface 205 of the dies 206 in FIG. 2 for ease of illustration. The second surface 207 of the dies 206 opposite the first surface has one or more terminals 208.

By attaching the dies 206 to a one-piece metal foil 202 such as a copper foil, subsequent lamination results in relatively linear shrinkage during the lamination process which can be more easily modeled to calculate a compensation factor. The metal foil 202 is eventually structured e.g. by etching, but after the dies 206 are first attached to the foil 202. In one embodiment, the first surface 205 of the dies 206 is the backside of the dies 206. The dies 206 can be attached to the metal foil 202 using any standard die attach material 210 and process such as soldering, diffusion soldering, sintering, gluing, etc. In the case of diffusion soldering, which is described in more detail later herein in connection with FIGS. 3 through 8, the metal foil 202 can be a copper foil. Other materials can be used such as nickel alloys like NiAu or NiCu for the metal foil 202, or any other metal materials compatible diffusion soldering.

In each case, the dies 206 can be diffusion soldered to the metal foil 202 in parallel as a batch process at a temperature less than 300° C. e.g. about 250° C. Diffusion soldering is typically performed serially (i.e. one die at a time) at a higher temperature of about 350° C. in order to reduce the overall die attach time. Diffusion soldering at a lower temperature of 300° C. or less results in slower phase formation (i.e. more time is needed for high melting point phases to form), but less warpage results because the die attach process temperature is significantly lower. Diffusion soldering the dies 206 to the metal foil 202 in parallel as part of a batch process reduces substantially the overall die attach process time compared to conventional serial die attach processes even though the die attach temperature is lower in the batch process. Alignment marks and jig holes can be manufactured in the metal foil 202 before die attach e.g. using a laser process such as UV-laser. Alignment marks and jig holes are not shown in FIG. 2 for ease of illustration.

By using a metal composite substrate 200 where the semiconductor dies 206 are attached to a metal foil 202 using a batch die attach process as shown in FIG. 2B, heat sink structures can be manufactured from the metal layer 204 of the metal composite substrate 202 e.g. with a selective etching process after lamination and patterning processes of the front surface. Some favorable characteristics of the resulting structure is that heat sinks are in metallurgical contact with the metal foil 202 where the dies 206 are attached and the heat sinks can be manufactured with an etching process after lamination and patterning of the front surface is done. Also, attaching the dies 206 to a relatively thin metal foil 202 (e.g. between 3 μm and 100 μm thick) allows the dies 206 to deform the metal foil 202 and therefore provide a stress release mechanism which is not possible for conventional thick Cu foils that do not deform during die attach.

Figure 2C:
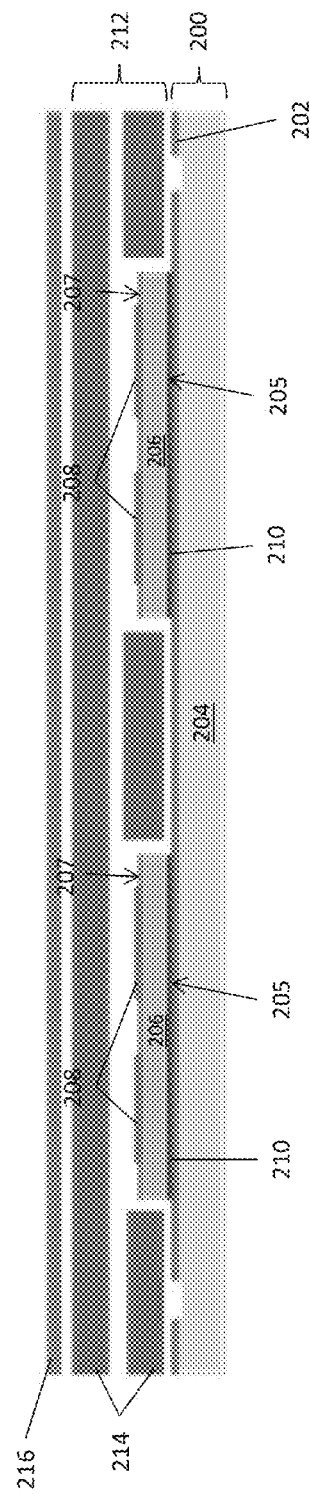
Figure 2D:
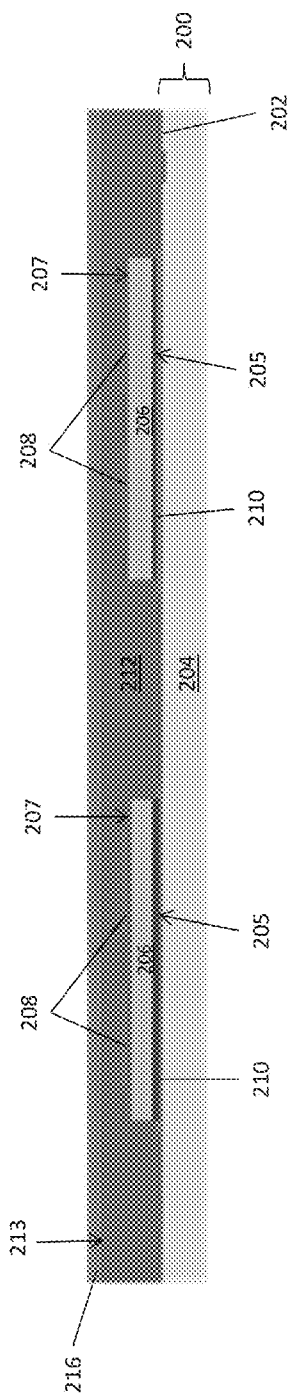

In FIGS. 2C and 2D, the semiconductor dies 206 attached to the metal foil 202 are encased in an electrically insulating material 212. According to the embodiment shown in FIGS. 2C and 2D, the electrically insulating material 212 is a laminate. In the case of lamination, the panel 200 can be placed e.g. in a jig table using a laser-structured prepregs 214 and Cu or Cu/Al top foil 216, can be structured with drilling, routing, punching, etc. or a material that needs no structuring such as polymer/resin films (or even printing, coating etc.) can be used. A prepreg comprises pre-impregnated composite fibers where a matrix material, such as epoxy, is already present. The lamination process can be performed in a standard PCB (printed circuit board) vacuum press system. During the press cycle, the prepreg resin 214 melts and fills the surroundings of the components 206 before the resin 214 fully crosslinks. Other electrically insulating materials 212 can be used to encase the semiconductor dies 206 such as a molding compound, epoxy, etc. The laminated structure can include a metal layer 216 on the surface 213 of the laminate 212 facing away from the metal composite substrate 200. In one embodiment, this metal layer 216 comprises copper.

Figure 2E:
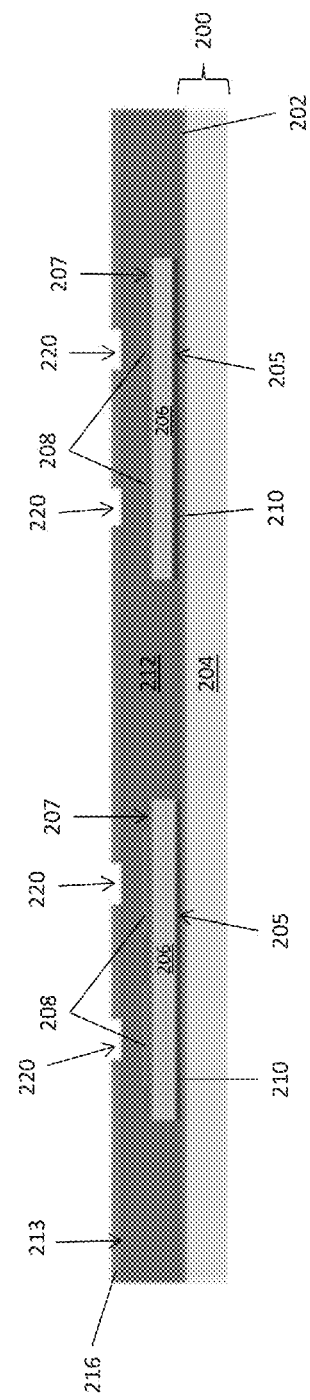
Figure 2F:
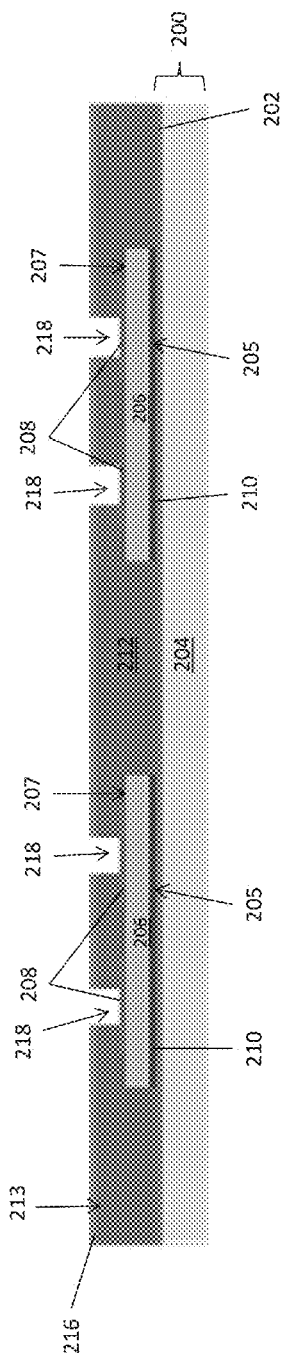

In FIGS. 2E and 2F, first micro-via openings 218 are formed in the electrically insulating material 212 which extend from the surface 213 of the electrically insulating material 212 facing away from the metal composite substrate 200 to the second surface 207 of the dies 206 i.e. the surface 207 of the dies 206 facing away from the metal composite structure 200. In the case of the electrically insulating material 212 being a laminate, the first micro-via openings 218 can be formed in a two-step process or with a direct laser drilling process. The two-step process includes first etching openings 220 into the metal layer 216 on the surface 213 of the laminate 212 facing away from the metal composite substrate 200 to form a mask. The laminate resin is then removed where exposed by the openings 220 in the metal layer 216 to form the first micro-via openings 218 in the electrically insulating material 212 e.g. using a CO2 laser.

Figure 2G:
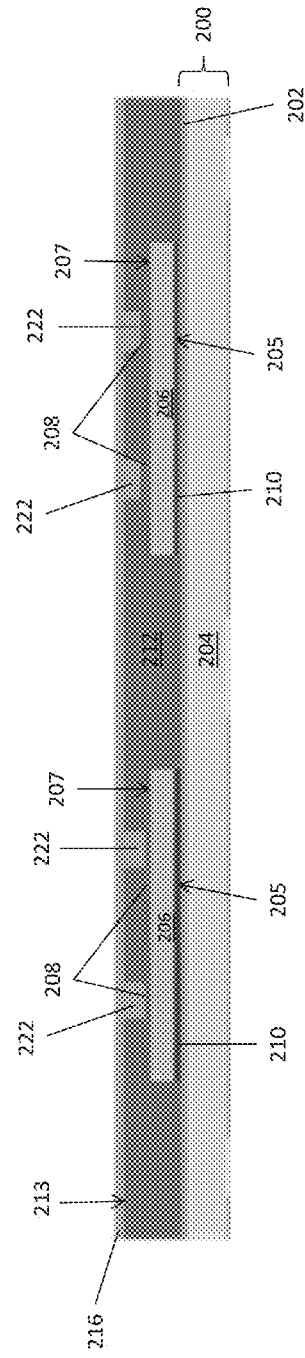

In FIG. 2G, the first micro-via openings 218 are filled e.g. using a direct metallization process or an electroless and electrochemical plating process or remain un-filled but plated or coated with an electrically conductive material. In each case, the resulting first micro-vias connections 222 extend through the electrically insulating material 212 from the terminals 208 at the second surface 207 of the dies 206 to the metal layer 216 on the surface 213 of the electrically insulating material 212 facing away from the metal composite substrate 200. Second micro-via connections can be similarly formed which extend through the electrically insulating material 212 from the metal foil 202 to the metal layer 216 on the surface 213 of the electrically insulating material 212 facing away from the metal composite substrate 200 e.g. as shown in FIG. 1. The second micro-via connections can connect one or more terminals at the first surface 205 of the dies 206 to the metal layer 216 on the surface 213 of the electrically insulating material 212 facing away from the metal composite substrate 200. Such second micro-via connections may not be needed e.g. in the case of a lateral transistor die in which all terminals 208 of the die 206 are provided at the second surface 207 of the die 206.

In FIG. 2H, the metal layer 204 of the metal composite substrate 200 is structured (patterned) to form heat sink structures 224. In one embodiment, a photoresist 226 is laminated/coated on the metal layer 204 after the micro-via connections 222 are formed. The photoresist 226 is exposed, developed and etched to expose regions of the metal layer 204. The exposed regions of the metal layer 204 are then removed e.g. using a highly selective etching process in the case of an aluminum metal layer to form the desired heat sink structures 224 which have tapered sidewalls 225.

In FIG. 2I, a photoresist 228 is laminated/coated on the metal layer 216 disposed on the surface 213 of the electrically insulating material 212 facing away from the metal composite substrate 200. The photoresist 228 is then exposed and developed to form a mask having a defined structure.

Figure 2J:
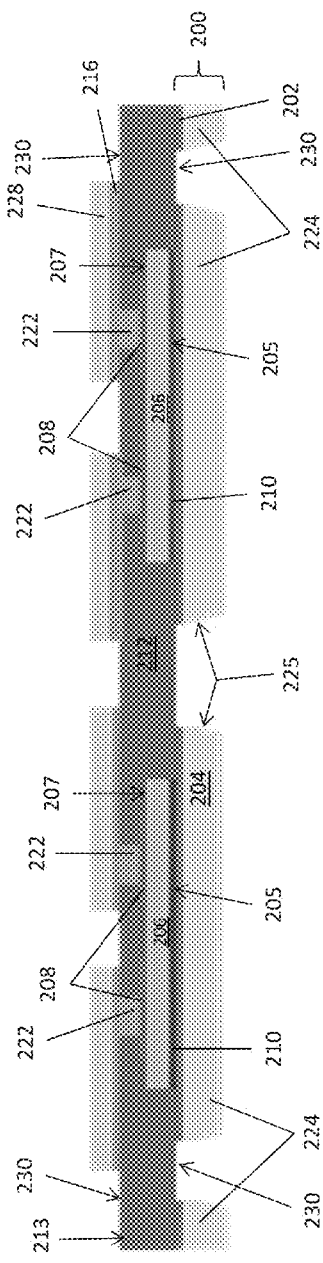

In FIG. 2J, the metal layer 216 on the surface 213 of the electrically insulating material 212 facing away from the metal composite substrate 200 is structured by etching the metal layer 216 using the developed photoresist 228 as a mask. The metal foil 202 at the opposite side of the structure is also etched using the previously structured metal layer 204 of the metal composite substrate 200 as a mask. That is, the heat sink structures 224 previously formed from the metal layer 204 of the metal composite substrate 200 expose regions of the metal foil 202 which are removed. The metal foil 202 and the metal layer 216 on the surface 213 of the electrically insulating material 212 facing away from the metal composite substrate 200 can be structured using the same etchant if both comprise the same material such as copper.

At this point in the manufacturing method, the metal layer 204 and the metal foil 202 of the metal composite substrate 200 have both been structured after the semiconductor dies 206 are encased with the electrically insulating material 212 so that surface regions 230 of the electrically insulating material 212 are devoid of the metal foil 202 and the metal layer 204 of the composite substrate 200 and devoid of the metal layer 216 on the surface 213 of the electrically insulating material 212 facing away from the metal composite substrate 200.

Figure 2K:
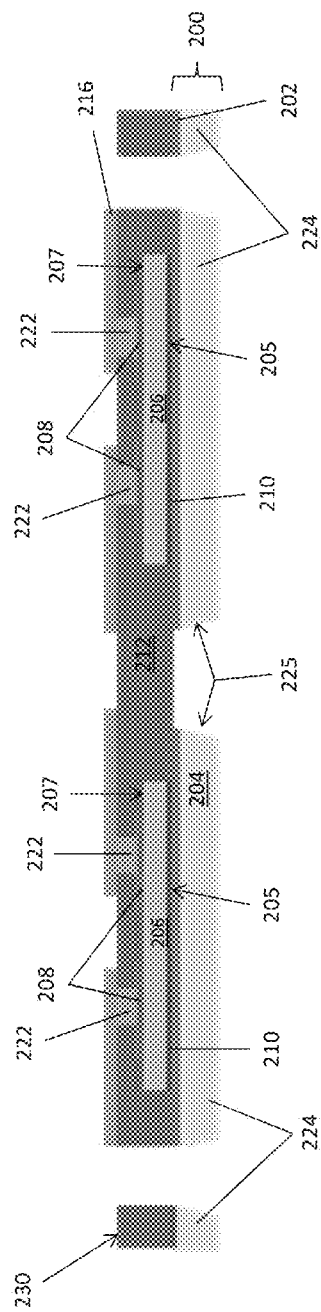

In FIG. 2K, the electrically insulating material 212 is divided along the surface regions 230 devoid of the metal structures 202, 204, 216 to form individual modules. This can include cutting the panel 200 to a strip size, coating the surface of the resulting strips with solder resist on the front side and separating the individual modules of each strip using a laminate dicing process.

The order of the process flow described in connection with FIG. 2 can be different. Also, additional build-up layers can be laminated to the top surface 213 of the electrically insulating material 212. The prepregs 214 can be replaced e.g. with structured laminates and resin films (e.g. bonding film) that bond the substrate 200, the structured laminate and the metal layer 216 together. The exposed (bottom) surface of the metal layer 204 of the metal composite substrate 200 can be protected e.g. with a thin laminate layer (not shown) that is placed on the backside e.g. during the batch die attach process. A Cu/Al composite substrate is only one option. Other metal foils and/or composite foils can also be used. Alternative soldering processes or materials also can be used to attach the dies 206 to the metal foil 202. For example a diffusion soldering process can be employed as previously described with reference to the die attach process, the result of which is illustrated in FIG. 2B.

Diffusion soldering is a hybrid of diffusion bonding and soldering. The principle of diffusion soldering is to run a minute volume of an interlayer of low melting point solder such as In, Sn or InSn into a joint between components that are pressed together and heated to form a liquid filler that solidifies by conversion to high melting point phases through isothermal reaction with the substrates. The liquid filler forms because the melting point of the interlayer solder is exceeded or due to a eutectic reaction between the low- and high-melting point components. The isothermal solidification of the liquid filler forms strong bonds at a relatively low temperature which then remain solid at much higher temperatures. The term 'lower melting point' as used herein with reference to the interlayer die attach solder used in the diffusion soldering process means that the solder has a lower melting point than the components being joined. The joint produced through inter-diffusion or reaction diffusion does not re-melt unless heated to the temperature at which the high melting point phases melt. Conventional diffusion soldering processes for semiconductor components involve applying the die attach solder to the wafer backside prior to die singulation (separation), which adversely impacts the wafer singulation process by requiring that a thick wafer backside metallization be cut through as part of the singulation process.

Figure 3:
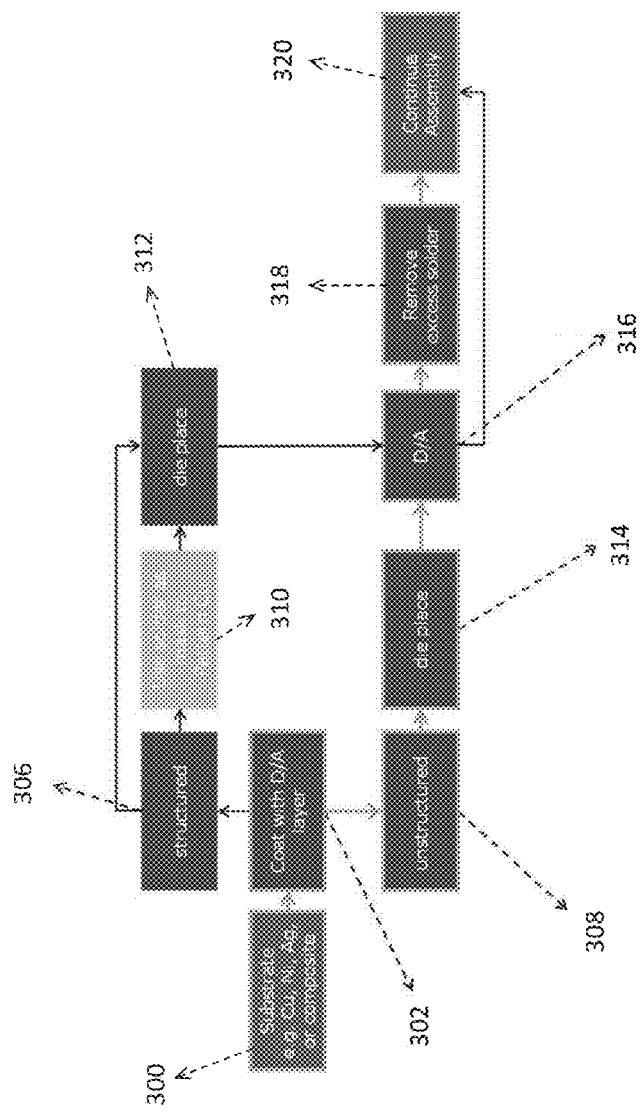
FIG. 3 illustrates an embodiment of a method of diffusion soldering semiconductor dies to a metal composite substrate.

FIG. 3 illustrates an embodiment of a method attaching semiconductor dies to a metal composite substrate e.g. of the kind previously described herein with reference to FIGS. 1 and 2, using a diffusion soldering process where the die attach solder is applied to the metal composite substrate instead of the dies. The method includes providing a metal composite substrate including a metal foil attached to a metal layer, the metal foil being thinner than and comprising a different material than the metal layer (Block 300). The metal foil can comprise Cu, Ni, Ag, etc. The surface of the metal foil opposite the metal layer is then coated with a die attach solder of a lower melting point than the metal foil and the metal layer (Block 302). The problem of solder 'squeeze out' is avoided by covering the entire or most of the metal foil with the die attach solder.

The die attach solder can be structured (Block 306) or remain unstructured (Block 308) prior to die attach. In the case of structuring the die attach solder, the structured solder can be used as a mask to pattern the underlying metal foil (Block 310) and the dies are then placed on the structured die attach material (Block 312). In the case of the die attach solder remaining unstructured prior to die attach, the dies are placed on the unstructured die attach material (Block 314).

In either case (structured or unstructured die attach solder), the dies are then attached to the metal foil by diffusion soldering whereby the dies and the metal composite substrate are pressed together and heated to form a liquid filler from the die attach solder that solidifies by conversion to high melting point phases through isothermal reaction with the dies and the metal composite substrate (Block 316). Excess solder such as the unreacted part of the solder i.e. the part of the solder that does not bond with the dies can be removed from the metal foil (Block 318) e.g. by selective etching. The module assembly process then continues (Block 320) e.g. by encasing the semiconductor dies in an electrically insulating material, forming micro-via connections and module singulation as previously described herein.

FIGS. 4 and 5 illustrate different stages of the diffusion soldering method shown in FIG. 3, for structured and unstructured die attach solders. FIG. 4, which includes FIGS. 4A through 4G, illustrates an embodiment of the diffusion soldering method in which the die attach solder remains unstructured prior to die attach. FIG. 5, which includes FIGS. 5A through 5I, illustrates an embodiment of the diffusion soldering method in which the die attach solder is structured prior to die attach.

In the case of the die attach solder remaining unstructured prior to the die attach process, a metal composite substrate 400 including a metal foil 402 attached to a metal layer 404 is provided and the surface 401 of the metal foil 402 opposite the metal layer 404 is coated with a die attach solder 406 of a lower melting point than the metal foil 402 and the metal layer 404 as shown in FIG. 4A. The metal foil 402 is thinner than and comprises a different material than the metal layer 404. For example, the metal layer 404 can be an aluminum layer having a thickness between 50 μm and 200 μm and the metal foil 402 can be a copper foil having a thickness between 3 μm and 100 μm. Other materials can be used such as nickel alloys like NiAu or NiCu for the metal foil 402, or any other metal materials compatible diffusion soldering. Any die attach solder 406 suitable for diffusion soldering can be used such as Sn, In, Zn or a solder alloy e.g. AuSn, SnAg, InAg, InSn or SAC solder, J-alloy or another sufficiently low melting metal or solder alloy.

In the case of structuring the die attach solder before the die attach process, a metal composite substrate 500 including a metal foil 502 attached to a metal layer 506 is provided and the surface 501 of the metal foil 502 opposite the metal layer 504 is coated with a die attach solder 506 of a lower melting point than the metal foil 502 and the metal layer 504 as shown in FIG. 5A. As described above in connection with FIG. 4A, the metal foil 502 is thinner than and comprises a different material than the metal layer 504. For example, the metal layer 504 can be an aluminum layer having a thickness between 50 µm and 200 µm and the metal foil 502 can be a copper foil having a thickness between 3 µm and 100 µm. Other materials can be used such as nickel alloys like NiAu or NiCu for the metal foil 502, or any other metal materials compatible diffusion soldering. Any die attach solder 506 suitable for diffusion soldering can be used such as Sn, In, Zn or a solder alloy e.g. AuSn, SnAg, InAg, InSn or SAC solder, J-alloy or another sufficiently low melting metal or solder alloy. Prior to die attach, the die attach solder 506 is structured e.g. using a photolithography process and etching as shown in FIG. 5B. The structured solder 506 is then used as a hard mark for structuring the metal foil 502 beneath the solder 506 e.g. by etching as shown in FIG. 5C.

In either embodiment of FIG. 4 or 5, one or more of a sinter layer, a solder paste and glue can be applied to the surface 401/501 of the metal foil 402/502 opposite the metal layer 404/504 before the semiconductor dies are diffusion soldered to the metal foil 402/502. Such additional layers are not shown in FIGS. 4 and 5 for ease of illustration.

In FIGS. 4B and 5D, semiconductor dies 408/508 are attached to the metal foil 402/502 at a first surface 407/507 of the dies 408/508 by diffusion soldering whereby the dies 408/508 and the metal composite substrate 400/500 are pressed together and heated to form a liquid filler from the die attach solder 406/506 that solidifies by conversion to high melting point phases through isothermal reaction with the dies 408/508 and the metal composite substrate 400/500. In one embodiment, a metallization 410/510 is applied to the first surface 407/507 of the semiconductor dies 408/508 before the first surface 407/507 of the dies 408/508 is diffusion soldered to the metal foil 402/502. For example, a backside metallization 410/510 such as Ti/Cu/Ag, Al/Ti/Cu/Ag or Al/Ti/NiV/Ag can be applied to the first surface 407/507 of the dies 408/508 and bonded to the die attach solder 406/506 by diffusion soldering. The opposite (second) surface 409/509 of the dies 408/508 faces away from the metal foil 402/502 and includes one or more terminals 412/512 such as bond pads.

In FIGS. 4C and 5E, excess solder 406/506 is removed from the surface 401/501 of the metal foil 402/502 to which the dies 408/508 are diffusion soldered e.g. using an etching process. The excess part of the die attach solder 406/506 uncovered by the dies 408/508 does not react i.e. bond with the dies 408/508 as part of the diffusion soldering process. As such, these unreacted parts of the solder 406/506 can be removed from the metal foil 402/502 after the dies 408/508 are diffusion soldered to the metal foil 402/502 and before the dies 408/508 are encased in an electrically insulating material.

In FIGS. 4D and 5F, the semiconductor dies 408/508 are encased in an electrically insulating material 414/514 after being diffusion soldered to the metal foil 402/502. In one embodiment, the electrically insulating material 414/514 is realized by a lamination process e.g. as described previously herein in connection with FIGS. 2C and 2D. The prepregs used in a standard lamination process can be replaced e.g. with structured laminates and resin films (e.g. bonding film) that bond the components together. Other electrically insulating materials 414/514 can be used to encase the semiconductor dies 408/508 such as a molding compound, epoxy, etc. In each case, a metal layer 416/516 such as a copper layer can be provided on the surface 413/513 of the electrically insulating material 414/514 facing away from the metal composite substrate 400/500.

In FIGS. 4E and 5G, first micro-via connections 418/518 are formed which extend through the electrically insulating material 414/514 from the terminals 412/512 at the second surface 409/509 of the dies 408/508 to the metal layer 416/516 on the surface 413/513 of the electrically insulating material 414/514 facing away from the metal composite substrate 400/500. Optional second micro-via connections 420/520 extend through the electrically insulating material 414/514 from the metal foil 402/502 to the metal layer 416/516 on the surface 413/513 of the electrically insulating material 414/514 facing away from the metal composite substrate 400/500. The micro-via connections 418/518, 420/520 can be manufactured using standard photolithography, etching and laser drilling processes e.g. as described previously herein in connection with FIGS. 2E, 2F and 2G.

In FIGS. 4F and 5H, the metal layer 404/504 of the metal composite substrate 400/500 is patterned using standard photolithography and selective etching processes. The structured metal layer 404/504 can be used as heat sinks in the final module products, or removed after structuring of the metal foil 402/502.

In FIGS. 4G and 5I, the metal layer 416/516 on the surface 413/513 of the electrically insulating material 414/514 facing away from the metal composite substrate 400/500 is structured e.g. using standard photolithography and selective etching processes. In the case of the metal foil 402/502 not being previously structured, the metal foil 402/502 can also be structured now using the structured metal layer 404/504 of the metal composite substrate 400/500 as a mask. The structured metal layer 404/504 of the metal composite substrate 400/500 can be removed after structuring of the metal foil 402/502, or can remain as heat sink structures 422/522. The electrically insulating material 414/514 can be divided along surface regions devoid of the metal foil 402/502 and the metal layers 404/504, 416, 516 to form individual modules e.g. as previously described herein in connection with FIGS. 2J and 2K.

FIG. 6, which includes FIGS. 6A through 6H, illustrate different stages of yet another embodiment of the diffusion soldering method shown in FIG. 3.

Figure 6A:
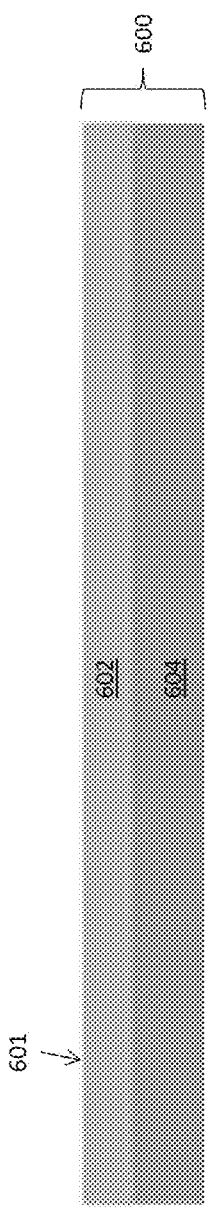

In FIG. 6A, a metal composite substrate 600 such as a Cu/Al substrate is provided that includes a metal foil 602 attached to a metal layer 604. The metal layer 604 underlying the metal foil 602 is used as a temporary carrier during the manufacturing process according to this embodiment. The metal foil 602 is thinner than and comprises a different material than the metal layer 604. For example, the metal layer 604 can be an aluminum layer having a thickness between 50 µm and 200 µm and the metal foil 602 can be a copper foil having a thickness between 3 µm and 100 µm. Other materials can be used such as nickel alloys like NiAu or NiCu for the metal foil 602, or any other metal materials compatible diffusion soldering.

Figure 6B:
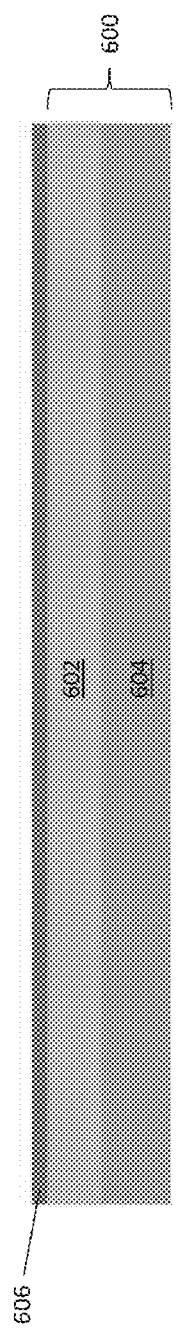

In FIG. 6B, a die attach solder 606 is applied to the exposed surface 601 of the metal foil 602. The solder material 606 can be e.g. Sn, In, Zn or a solder alloy e.g. AuSn, SnAg, InAg, InSn or SAC solder, J-alloy or another sufficiently low melting metal or solder alloy. In addition to covering the exposed surface 601 of the metal foil 602 with the solder material 606, one or more additional materials (not shown for ease of illustration) such as glue, nano-paste, a sintering material, etc. can also be applied to the surface 601 of the metal foil 602.

In FIG. 6C, the die attach solder 606 is structured e.g. using standard photolithography and etching processes. The structured die attach solder 606 can be used as a hard mark for structuring the metal foil 602 beneath the solder 606. Alternatively, the metal foil 602 can be structured before application of the solder 606 to the metal composite substrate 600.

In FIG. 6D, semiconductor dies 608 (only one is shown for ease of illustration) with a backside metallization 610 such as Ti/Cu/Ag, Al/Ti/Cu/Ag or Al/Ti/NiV/Ag are bonded to the die attach solder 606 via diffusion soldering as previously described herein. In general the backside metallization 610 can include any suitable material system for soldering, including a contact layer for providing electrical contact with a semiconductor material (e.g. Si, SiN, GaAs, GaN, etc.) a barrier layer (e.g. Ti, TiW, W, etc.) and one or more functional layers (Cu, Ni, Ag, etc.) and on or several layers (e.g. Cu/Ag, etc.) to provide electrical contact formation with the die attach material 606. The dies 608 have terminals 612 disposed at the second surface 609 of the dies 608 opposite the first surface 607. The first surface 607 of the dies is diffusion soldered to the metal foil 602. The metal foil 602 can be previously structured as shown in FIG. 6D, or remain unstructured at this point in the process.

In FIG. 6E, excess solder 606 is optionally removed from the top surface 601 of the metal foil 602 e.g. using an etching process as previously described herein in connection with FIGS. 4C and 5E.

In FIG. 6F, layup and lamination with a laminate 614 and topside metallization 616 can be done using standard layup and lamination processes and materials as previously described herein e.g. in connection with FIGS. 4D and 5F.

Figure 6G:
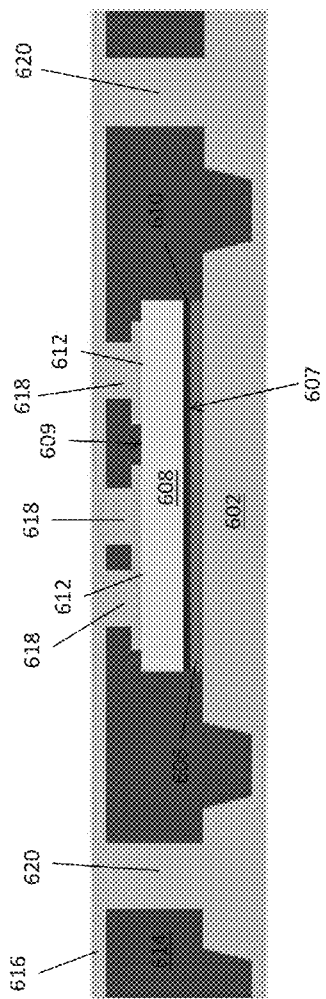

In FIG. 6G, the metal layer 604 of the metal composite substrate 600 is removed e.g. with a selective etching process. Micro-via connections 618, 620 are also formed e.g. using standard photolithography, etching, laser drilling and plating processes as previously described herein e.g. in connection with FIGS. 4E and 5G.

Figure 6H:
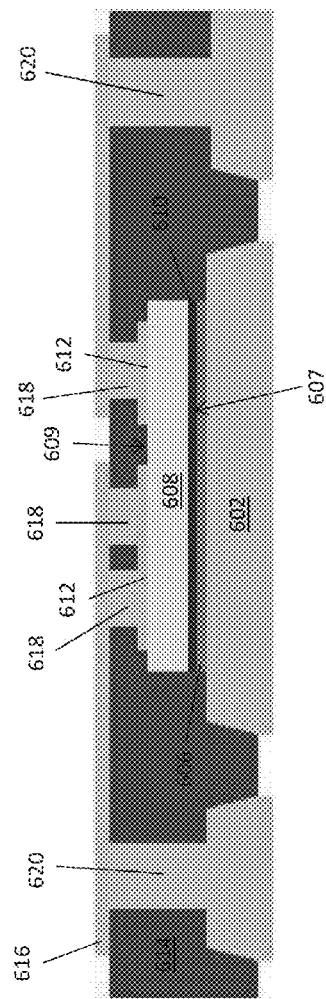

In FIG. 6H, the topside metal layer 616 on the electrically insulating material laminate 614 is structured e.g. using standard photolithography and selective etching processes. In case the metal foil 602 was not structured in advance, the metal foil 602 can be structured during the same process step by applying a photoresists as masks.

Figure 7:
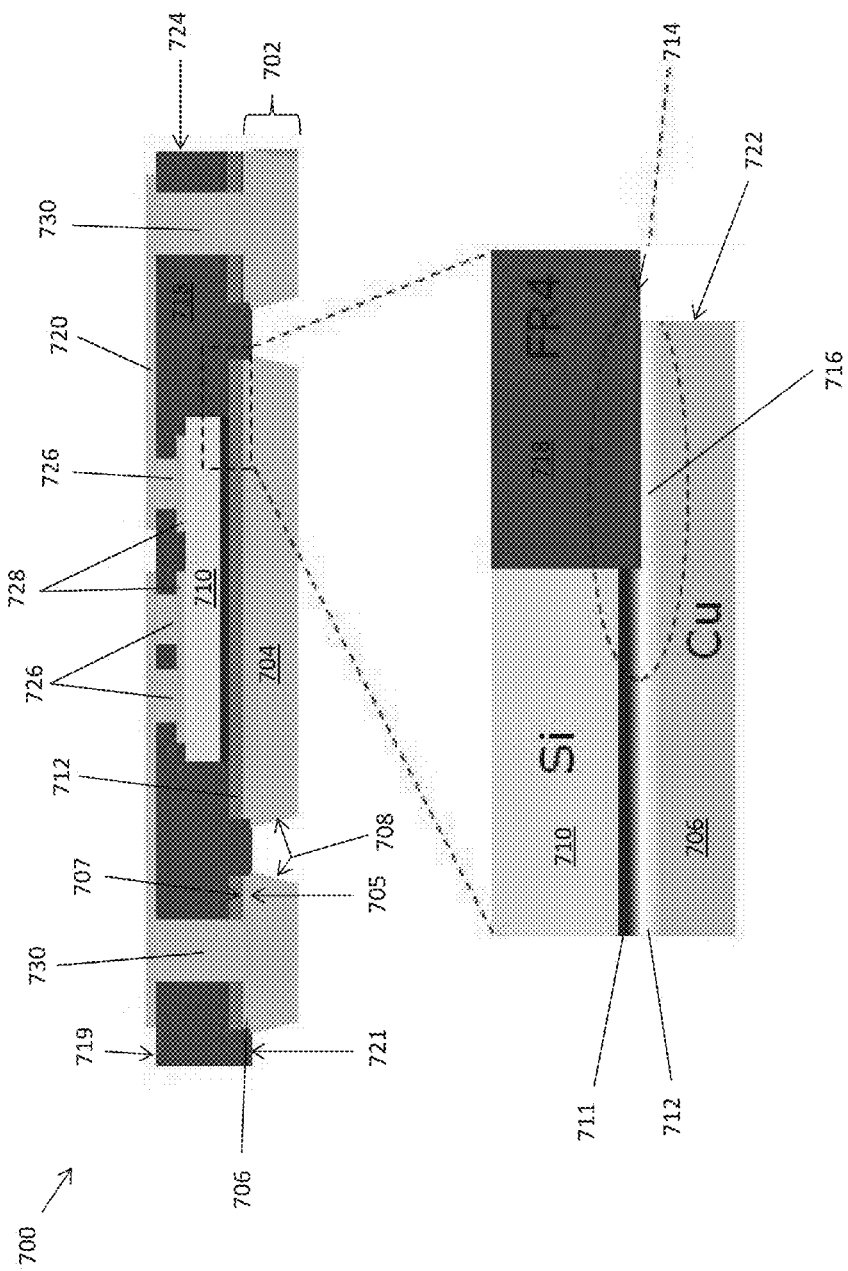
FIG. 7 illustrates an embodiment of a semiconductor module manufactured based on the diffusion soldering method of FIG. 3.

FIG. 7 illustrates a cross-sectional view of an embodiment of a semiconductor module 700 manufactured in accordance with the method of FIG. 3. The semiconductor module 700 comprises a metal composite substrate 702 including a metal layer 704 such as an aluminum layer attached to a first surface 705 of a structured metal foil 706 such as a copper foil. The structured metal foil 706 has a second surface 707 opposite the first surface 705 and is thinner than the metal layer 704. For example, the metal layer 704 can have a thickness between 50 μm and 200 μm and the metal foil 706 can have a thickness between 3 μm and 100 μm. The metal layer 704 has tapered sidewalls 708 extending outward from the second surface 707 of the structured metal foil 706.

The semiconductor module 700 further comprises at least one semiconductor die 710 diffusion soldered to the second surface 707 of the structured metal foil 706 in accordance with the method of FIG. 3. That is, a die attach solder 712 is applied to the surface 707 of the metal foil 706 to which each die 710 is to be attached. The die(s) 710 are then pressed against the metal foil 706 under pressure and temperature, so that each die 710 is diffusion bonded to the metal foil 706 via high melting point phases formed by isothermal solidification of the die attach solder 712 as previously described herein. The surface of each die 710 diffusion soldered to the metal foil 706 can have a metallization 711 as previously described herein.

FIG. 7 includes an exploded view of the interface between one die 710 and the metal foil 706 in a corner region 714 of the module 700. According to this embodiment, unreacted parts 716 of the die attach solder 712 are not removed from the metal foil 706 before diffusion soldering the dies 710 to the metal foil 706. Any type of semiconductor die 710 can be diffusion soldered to the metal foil 702, such as power semiconductor dies like power MOSFETs or IGBTs, one or more logic dies (e.g. driver, controller), etc. A laminate 718 such as FR4 is attached to the second surface 707 of the structured metal foil 706. A structured metal layer 720 is provided on the laminate 718. The laminate 718 encases the semiconductor dies 710.

The structured metal foil 706 has sidewalls 722 extending outward from the laminate 718. The sidewalls 722 of the structured metal foil 706 are uncovered by the laminate 718 and aligned with the sidewalls 708 of the metal layer 704 of the metal composite substrate 702. The laminate 718 has an edge 724 extending between the opposing main surfaces 719, 721 of the laminate 718. The edge 724 of the laminate 718 is uncovered by metal.

One or more first micro-via connections 726 can extend through the laminate 718 from die terminals 728 at a surface of the dies 710 opposite the structured metal foil 706 to the structured metal layer 720 on the surface 719 of the laminate 718 facing away from the metal composite substrate 702. The first micro-via connections 726 provide points of external electrical contact for the die terminals 728 at the surface of the dies 710 opposite the metal composite substrate 702.

One or more second micro-via connections 730 extend through the laminate 718 from the structured metal foil 706 to the structured metal layer 720 on the surface 719 of the laminate 718 facing away from the metal composite substrate 702. The second micro-via connections 730 provide points of external electrical contact for terminals (if provided) at the surface of the dies 710 diffusion soldered to the metal foil 706. If one or more of the dies 710 do not have a terminal at this surface (e.g. in the case of lateral transistor dies), then the second micro-via connections 730 can be omitted. The metal layer 704 of the metal composite substrate 702 acts as a heat sink during operation of the dies 710, dissipating heat from the dies 710 through the structured metal foil 706.

Figure 8:
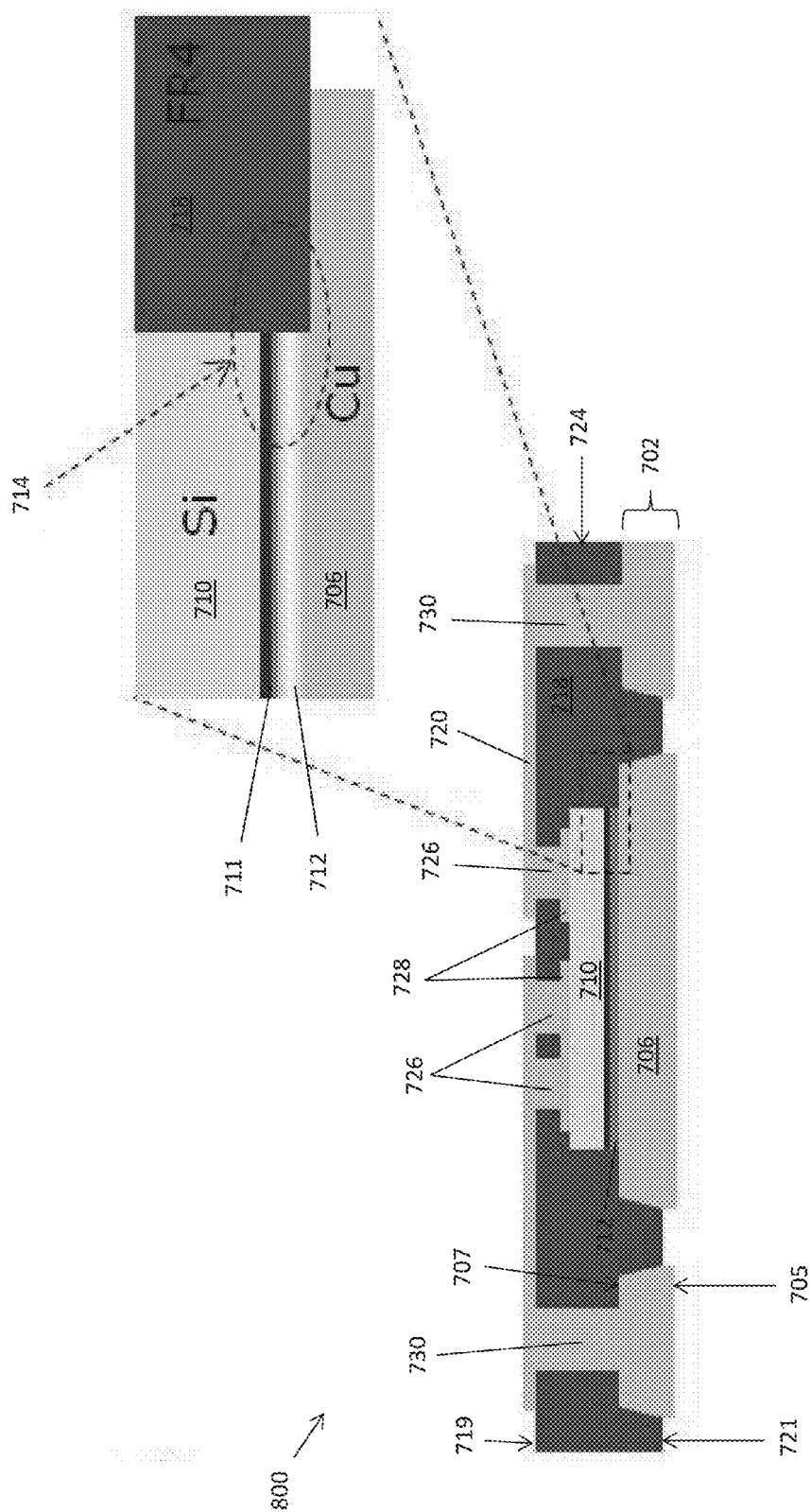
FIG. 8 illustrates another embodiment of a semiconductor module manufactured based on the diffusion soldering method of FIG. 3.

FIG. 8 illustrates a cross-sectional view of another embodiment of a semiconductor module 800 manufactured in accordance with the method of FIG. 3. The embodiment shown in FIG. 8 is similar to the embodiment shown in FIG. 7, however, the unreacted parts 716 of the die attach solder 712 are removed from the metal foil 706 before diffusion soldering of the dies 710 to the metal foil 706 as shown in greater detail in the exploded view of FIG. 8.

Spatially relative terms such as "under", "below", "lower", "over", "upper" and the like, are used for ease of description to explain the positioning of one element relative to a second element. These terms are intended to encompass different orientations of the device in addition to different orientations than those depicted in the figures. Further, terms such as "first", "second", and the like, are also used to describe various elements, regions, sections, etc. and are also not intended to be limiting. Like terms refer to like elements throughout the description.

As used herein, the terms "having", "containing", "including", "comprising" and the like are open-ended terms that indicate the presence of stated elements or features, but do not preclude additional elements or features. The articles "a", "an" and "the" are intended to include the plural as well as the singular, unless the context clearly indicates otherwise.

With the above range of variations and applications in mind, it should be understood that the present invention is not limited by the foregoing description, nor is it limited by the accompanying drawings. Instead, the present invention is limited only by the following claims and their legal equivalents.

What is claimed is:

1. A method of manufacturing semiconductor modules, the method comprising:
providing a metal composite substrate including a metal foil attached to a metal layer, the metal foil being thinner than and comprising a different material than the metal layer;
attaching a first surface of a plurality of semiconductor dies to the metal foil prior to structuring the metal foil;
encasing the semiconductor dies attached to the metal foil in an electrically insulating material;
structuring the metal layer and the metal foil after the semiconductor dies are encased with the electrically insulating material so that surface regions of the electrically insulating material are devoid of the metal foil and the metal layer; and
dividing the electrically insulating material along the surface regions devoid of the metal foil and the metal layer to form individual modules,
wherein structuring the metal layer and the metal foil comprises:
masking the metal layer so that regions of the metal layer are exposed;
removing the exposed regions of the metal layer so that regions of the metal foil are exposed; and
removing the exposed regions of the metal foil using the remaining metal layer as a mask.

2. The method of claim 1, wherein the metal layer is an Al layer having a thickness between 50 µm and 200 µm and the metal foil is a Cu foil having a thickness between 3 µm and 100 µm thick.

3. The method of claim 1, wherein attaching the first surface of the dies to the metal foil prior to structuring the metal foil comprises diffusion soldering the first surface of the dies to the metal foil.

4. The method of claim 1, wherein attaching the first surface of the dies to the metal foil prior to structuring the metal foil comprises soldering, sintering or gluing the first surface of the dies to the metal foil.

5. The method of claim 1, wherein attaching the first surface of the dies to the metal foil prior to structuring the metal foil comprises:
coating a surface of the metal foil opposite the metal layer with solder of a lower melting point than the metal foil and the metal layer; and
diffusion soldering the first surface of the semiconductor dies to the metal foil via the solder, including isothermal solidification of the solder to high melting point phases.

6. The method of claim 5, further comprising:
removing unreacted parts of the solder from the metal foil after the first surface of the semiconductor dies is diffusion soldered to the metal foil and before the semiconductor dies are encased in the electrically insulating material.

7. The method of claim 1, wherein the electrically insulating material is a laminate.

8. The method of claim 1, further comprising:
forming one or more first connections extending through the electrically insulating material from a second surface of the dies opposite the first surface to a structured metal layer on a surface of the electrically insulating material facing away from the metal composite substrate; and
forming one or more second connections extending through the electrically insulating material from the metal foil to the structured metal layer on the surface of the electrically insulating material facing away from the metal composite substrate.

9. A method of attaching semiconductor dies to a metal composite substrate, the method comprising:
providing a metal composite substrate including a metal foil attached to a metal layer, the metal foil being thinner than and comprising a different material than the metal layer;
coating a surface of the metal foil opposite the metal layer with solder of a lower melting point than the metal foil and the metal layer;
soldering a first surface of a plurality of semiconductor dies to the metal foil via the solder, including isothermal solidification of the solder to high melting point phases; and
encasing the semiconductor dies in an electrically insulating material after the first surface of the semiconductor dies is diffusion soldered to the metal foil.

10. The method of claim 9, further comprising:
applying one or more of a solder paste layer, a sinter layer, a solder paste and glue to the surface of the metal foil opposite the metal layer before the first surface of the semiconductor dies is diffusion soldered to the metal foil.

11. The method of claim 9, further comprising:
removing unreacted parts of the solder from the metal foil after the first surface of the semiconductor dies is diffusion soldered to the metal foil and before the semiconductor dies are encased in the electrically insulating material.

12. The method of claim 9, further comprising:
applying a metallization to the first surface of the semiconductor dies before the first surface of the semiconductor dies is diffusion soldered to the metal foil.

13. The method of claim 9, further comprising:
structuring the metal layer and the metal foil so that surface regions of the electrically insulating material are devoid of the metal foil and the metal layer; and
dividing the electrically insulating material along the surface regions devoid of the metal foil and the metal layer to form individual modules.

14. The method of claim 13, wherein structuring the metal layer and the metal foil so that surface regions of the electrically insulating material are devoid of the metal foil and the metal layer comprises:
masking the metal layer after the semiconductor dies are encased in the electrically insulating material so that regions of the metal layer are exposed;
removing the exposed regions of the metal layer so that regions of the metal foil are exposed; and
removing the exposed regions of the metal foil using the remaining metal layer as a mask.

15. The method of claim 9, further comprising:
structuring the solder before the first surface of the semiconductor dies is diffusion soldered to the metal foil.

16. The method of claim 15, further comprising:
structuring the metal foil using the structured solder as a mask before the first surface of the semiconductor dies is diffusion soldered to the metal foil.

17. The method of claim 16, further comprising:
removing unreacted parts of the structured solder from the metal foil after the first surface of the semiconductor dies is diffusion soldered to the metal foil and before the semiconductor dies are encased in the electrically insulating material.

18. The method of claim 9, further comprising:
removing the metal layer from the metal foil after the first surface of the dies is diffusion soldered to the metal foil and the semiconductor dies are encased with the electrically insulating material.

19. The method of claim 9, wherein the metal layer is an Al layer having a thickness between 50 μm and 200 μm, and wherein the metal foil is a Cu foil having a thickness between 3 μm and 100 μm.

20. A method of manufacturing semiconductor modules, the method comprising:
providing a metal composite substrate including a metal foil attached to a metal layer, the metal foil being thinner than and comprising a different material than the metal layer;
attaching a first surface of a plurality of semiconductor dies to the metal foil prior to structuring the metal foil;
encasing the semiconductor dies attached to the metal foil in an electrically insulating material;
structuring the metal layer and the metal foil after the semiconductor dies are encased with the electrically insulating material so that surface regions of the electrically insulating material are devoid of the metal foil and the metal layer;
dividing the electrically insulating material along the surface regions devoid of the metal foil and the metal layer to form individual modules;
forming one or more first connections extending through the electrically insulating material from a second surface of the dies opposite the first surface to a structured metal layer on a surface of the electrically insulating material facing away from the metal composite substrate; and
forming one or more second connections extending through the electrically insulating material from the metal foil to the structured metal layer on the surface of the electrically insulating material facing away from the metal composite substrate.

* * * * *